United States Patent
Yang et al.

(10) Patent No.: US 8,130,481 B2
(45) Date of Patent: Mar. 6, 2012

(54) ELECTROSTATIC DISCHARGE TRIGGER CIRCUITS FOR SELF-PROTECTING CASCODE STAGES

(75) Inventors: Jinyu Yang, Plano, TX (US); Dening Wang, McKinney, TX (US); Gregory George Romas, Jr., McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 799 days.

(21) Appl. No.: 12/186,323

(22) Filed: Aug. 5, 2008

(65) Prior Publication Data

US 2009/0040678 A1  Feb. 12, 2009

Related U.S. Application Data

(60) Provisional application No. 60/954,666, filed on Aug. 8, 2007.

(51) Int. Cl.
*H02H 9/04* (2006.01)
(52) U.S. Cl. .......................... 361/56; 361/111
(58) Field of Classification Search .............. 438/300, 438/504, 592; 361/56, 111
See application file for complete search history.

(56) References Cited

U.S. PATENT DOCUMENTS

| | | | |
|---|---|---|---|
| 5,796,767 A * | 8/1998 | Aizawa | 372/38.02 |
| 6,104,589 A * | 8/2000 | Williamson | 361/111 |
| 6,414,532 B1 | 7/2002 | Der Su et al. | |
| 6,747,857 B1 | 6/2004 | Lee et al. | |
| 6,898,062 B2 | 5/2005 | Russ et al. | |
| 7,233,471 B2 | 6/2007 | Jiang et al. | |
| 2005/0231966 A1 * | 10/2005 | Ostler et al. | 362/458 |
| 2006/0001098 A1 * | 1/2006 | Yang et al. | 257/355 |
| 2006/0117462 A1 * | 6/2006 | Wysopal | 2/209.13 |
| 2008/0049365 A1 | 2/2008 | Worley et al. | |
| 2008/0316659 A1 * | 12/2008 | Oguzman et al. | 361/56 |

OTHER PUBLICATIONS

Commissioner, International Searching Authority, Notification of Transmittal of the International Search Report and the Written Opinion of the International Searching Authority, or the Declaration, regarding International Application No. PCT/US2008/072642, International Filing date Aug. 8, 2008.

* cited by examiner

*Primary Examiner* — Stephen W Jackson
*Assistant Examiner* — Angela Brooks
(74) *Attorney, Agent, or Firm* — John J. Patti; Wade J. Brady, III; Frederick J. Telecky, Jr.

(57) ABSTRACT

Electrostatic discharge (ESD) protection circuits for self-protecting cascode stages are disclosed. In one example, an ESD protection circuit is described. A cascode stage is configured to selectively couple an output pad to a reference terminal. An ESD sensor may detect a change in voltage indicative of an ESD event occurring at the output pad, causing a gate drive to turn on the cascode stage to conduct ESD current in response to detection of the ESD event at the output pad. A leakage blocker is also included to prevent leakage current from the cascode stage to the gate drive while there is not an ESD event.

25 Claims, 4 Drawing Sheets

ELECTROSTATIC DISCHARGE TRIGGER CIRCUITS FOR SELF-PROTECTING CASCODE STAGES

RELATED APPLICATIONS

This application claims the benefit of U.S. Provisional Application No. 60/954,666, filed Aug. 8, 2007, the entirety of which is incorporated by reference.

FIELD OF THE DISCLOSURE

This disclosure relates generally to electrostatic discharge protection and, more particularly, to electrostatic discharge trigger circuits for self-protecting cascode stages.

BACKGROUND

Electrostatic discharge (ESD) is a brief electric current that flows between two objects at different electrical potentials. ESD can cause major problems in electrical devices, such as integrated circuits (ICs), because ESD can result in very large potential differences that can destroy the fragile circuits in an IC. For example, ESD can occur from human handling of a device or from being transferred between an object (e.g., a human, manufacturing equipment, test equipment) that is poorly grounded or not grounded at all and an object that is grounded (e.g., an electrically grounded circuit). Circuits are therefore often equipped with ESD preventative or protective measures, such as protective circuits or anti-static packaging.

SUMMARY

Electrostatic discharge (ESD) trigger circuits for self-protecting cascode stages are disclosed. In one example, an ESD trigger circuit is described. A cascode stage is configured to selectively couple an output pad to a reference terminal. According to one example, an ESD sensor detects a change in voltage indicative of an ESD event occurring at the output pad, thereby causing a gate drive to turn on the cascode stage in response to detection of the ESD event at the output pad. A current blocker is also included to prevent current from flowing from the cascode stage to the output pad through the gate drive while there is not an ESD event.

DETAILED DESCRIPTION

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof. Accordingly, while the following describes example apparatus, persons of ordinary skill in the art will readily appreciate that the examples are not the only way to implement such apparatus.

The example devices described herein may be used to provide a cascode stage with protection from electrostatic discharge (ESD) events. In addition, example implementations are configured such that the ESD trigger device does not interfere with normal operation of the cascode stage. The example ESD trigger devices described have the benefit of a reduced area requirement compared to typical ESD trigger circuits. Thus, sufficient ESD trigger devices may be used to protect a larger number of output stages than was previously possible or cost efficient. In another example, an ESD trigger device may be provided with a capacitive element to adjust a sensitivity of the ESD trigger device to ESD events and alternating current (AC) operation of the output stage.

Figure 1:
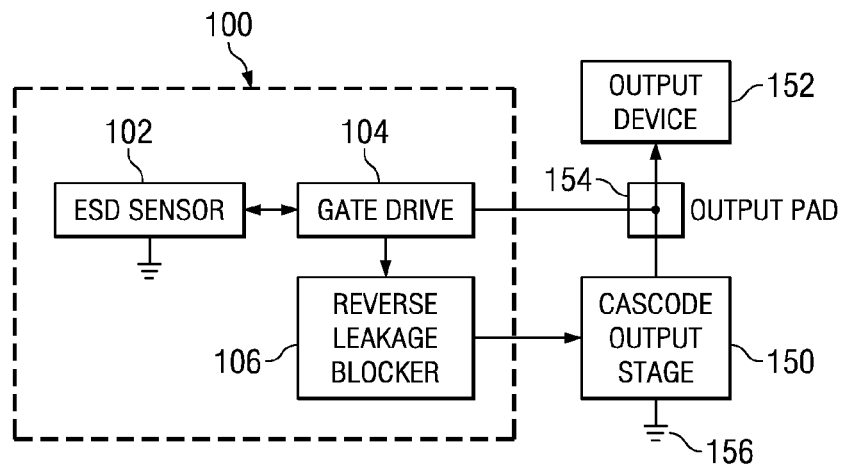
FIG. 1 is a block diagram of an example electrostatic discharge trigger device for a cascode stage.

FIG. 1 is a block diagram of an example ESD trigger device or ESD circuit 100 for a cascode stage 150. The cascode stage or cascode circuit 150 may be implemented to selectively couple an output device 152 (e.g., a light-emitting diode) to a reference voltage to permit current to flow therethrough. In an example integrated circuit (IC) implementation, the cascode stage 150 is coupled to the output device 152 via an output pad 154, such as a solder pad on a printed circuit board. Such output pads are potentially exposed to sources of electrostatic potential (e.g., a human touch), which cause very high voltages for a very short period of time. Without proper deflection of the energy contained in the electrostatic potential, the high voltage can severely damage a circuit and/or render the circuit inoperable.

Standard ESD protection circuits to protect an output pad require a large IC area to implement. In small-package ICs with many cascode stages (e.g., 8-16 output stages), the ESD protection circuits can take a prohibitively large amount of IC area. However, foregoing an ESD protection cell altogether runs a great risk of damaging or destroying the cascode stage 150, because the cascode stage 150 is not capable of self-protecting from ESD events. Typical cascode stage pre-drivers cannot generate voltages sufficient to fully turn on the output transistors during an ESD event.

Therefore, the cascode stage 150 is provided with the example ESD trigger circuit 100, including an ESD sensor 102, a gate drive 104, and a reverse current blocker 106. The ESD sensor 102 detects an ESD event by monitoring the output pad 154 (via the gate drive 104) for rapid voltage or current changes that are indicative of an ESD event. For example, a high voltage change in a short period of time may be indicative of an ESD event. However, because the voltage at the output pad 154 may change in response to switching activity by the cascode stage 150, the ESD sensor 102 may be configured to monitor the output pad 154 for a particular range of frequencies.

The example gate drive 104 fully or substantially fully turns on the cascode stage 150 (via the reverse current blocker 106) in response to the ESD sensor 102, thereby allowing the cascode stage 150 to discharge or divert the electrostatic energy from the output pad 154 to a ground terminal 156 (e.g., 0V). To achieve the discharge, the gate drive 104 provides a sufficient voltage to turn on a low-resistance current path from the output pad 154 to the ground terminal 156 via the cascode stage 150.

As shown below, the example ESD sensor 102 and gate drive 104 drive the cascode stage 150 to discharge electrostatic energy during an ESD event. However, during normal operation (i.e., when there is no ESD event occurring) the output pad 154 may often have a voltage lower than a driving voltage of the cascode stage 150. If the gate drive 104 is coupled directly to the cascode stage 150, typical driving voltages from the cascode stage 150 may cause reverse current to flow to the output pad 154 via the gate drive 104. To prevent the reverse current, the ESD trigger device 100 is further provided with a reverse current blocker 106, coupling the gate drive 104 to the cascode stage 150 and preventing reverse current from the cascode stage 150 from flowing to the output pad 154 via the gate drive 104.

Figure 2:
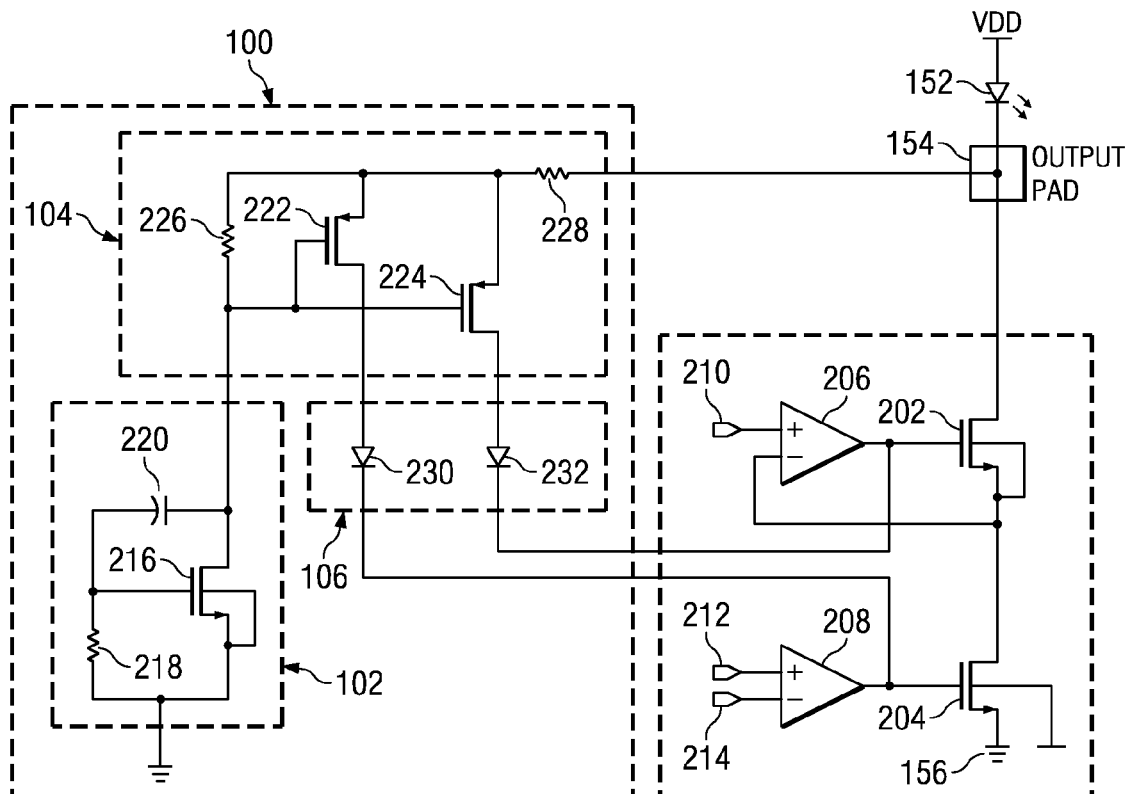
FIG. 2 is a more detailed schematic diagram of the example electrostatic discharge trigger device described in FIG. 1.

FIG. 2 is a more detailed schematic diagram of the example ESD trigger device 100 described in FIG. 1. As mentioned above, the ESD trigger device 100 protects the cascode stage 150 from damage in the case of an ESD event. In the example of FIG. 2, the cascode stage 150 is shown to selectively couple an output device 152 (e.g., a light-emitting diode) to the ground terminal 156 via the output pad 154. In particular, the cascode stage 150 includes a cascode transistor 202 and a drive transistor 204 (i.e., output transistors), which are driven by a pre-drivers 206 and 208, respectively. The pre-drivers 206 and 208 may be implemented as operational amplifiers (op-amps) that generate gate voltages to allow currents through the transistors 202 and 204 to control the output device 152 (e.g., to light the LED). The currents through the output transistors 202 and 204 are based on signals 210, 212, and 214, which are controlled by an input circuit (not shown). The signals may be indicative of a desired brightness of the example light-emitting diode output device 152.

During an ESD event, the pre-drivers 206 and 208 are incapable of generating sufficient voltage to fully turn on both output transistors 202 and 204 to discharge the electrostatic energy to the ground terminal 156. As mentioned above, the cascode stage 150 is provided with the ESD trigger device 100, including the ESD sensor 102, the gate drive 104, and the reverse current blocker 106.

In one example, the ESD sensor 102 includes a gate-coupled transistor 216, a resistor 218, and a capacitor 220. The gate drive or driver 104 includes a driving transistors or control circuits 222 and 224, and resistors 226 and 228. The ESD sensor 102 may detect an ESD event based on a rapid change in voltage at the output pad, which may be detected at the gate-coupled transistor 216 via the resistors 226 and 228. The combined capacitance of the gate-coupled transistor 216 and the capacitor 220 results in a charge at the gate terminal of the gate-coupled transistor 216 when a rapidly increasing voltage is applied to the drain terminal. The charge causes the gate-coupled transistor 216 to conduct current.

As the gate-coupled transistor 216 begins conducting current, a voltage drop is generated over the resistor 226 that turns on the driving transistors 222 and 224. Thus, the driving transistor 222 increases the voltage at the gate of the drive transistor 204, which turns on the drive transistor 204 fully or substantially fully (via the reverse current blocker 106). Similarly, the driving transistor 224 causes the cascode transistor 202 to turn on fully or substantially fully (via the reverse current blocker 106). With both output transistors 202 and 204 on, a low-resistance path is created through which the electrostatic energy is discharged to the ground terminal 156 thereby bypassing ESD-sensitive circuitry.

The resistor 218 and the capacitor 220 create a resistor-capacitor (RC) gate coupling that determines how long the gate-coupled transistor 216 conducts current. In one example, it is desirable to have an RC time constant greater than 200 nanoseconds (ns) to properly discharge the electrostatic energy. If the resistance value of the resistor 218 is set to approximately 1 megaohm (MΩ) to provide a weak pull-down, the capacitor 220 must have a capacitance greater than $200 \times 10^{-15}$ farads. In some examples, the parasitic gate-drain capacitance of the gate-coupled transistor 216 may provide sufficient capacitance to achieve the desired time constant. The example resistor 226 is implemented using a resistance value of approximately 20 kilo-ohms (kΩ) and the example resistor 228 is implemented using a resistance of 15 ohms (Ω). These values allow the example resistor 226 to generate a sufficient voltage drop to turn on the driving transistors 222 and 224. The resistor 228 functions as a blocking resistor, to divert the majority of the electrostatic energy through the output transistors 202 and 204. Although particular resistance, capacitance, and time constant values are discussed with reference to the example of FIG. 2, it should be recognized that these values may be modified depending on, for example, the application or manufacturing process.

Further, although the capacitor 220 is shown in FIG. 2 as included in the ESD sensor 102, the capacitor 220 may be removed from the ESD sensor 102 and replaced with an open circuit. The capacitor 220 adds additional capacitance to the parasitic gate capacitance of the gate-coupled transistor 216. The additional capacitance may, for example, modify the frequency response of the gate-coupled transistor 216 or tune the ESD trigger device 100 to ignore operating frequencies of the cascode stage 150. Without the capacitor 220, particular operating frequencies or other transients may improperly trigger the ESD trigger device 100 to drive the gates of the output transistors 202 and 204. The capacitor 220 may be replaced by any suitable type of capacitive element, or modified to use several capacitive elements to achieve a desired net capacitance.

The resistor 228 is implemented between the output pad 154 and the source terminals of the driving transistors 222 and 224. This offers the output transistors 202 and 204 and the pre-drivers 206 and 208 protection from the full voltage of the ESD event, which could cause damage. The resistor 228 may be implemented using any suitable resistance. Further, the resistor 226 is configured to produce a sufficient voltage drop to turn on the driving transistors 222 and 224.

Typically, an ESD event causes the voltage at the event location (e.g., the output pad 154) to increase to very high voltages within 2 ns to 10 ns if the ESD event is not handled quickly. Thus, the example ESD trigger device 100 detects the ESD event, and turns on the driving transistors 222 and 224 and the output transistors 202 and 204 to within 5 ns to prevent high voltage from damaging or destroying the cascode stage 150. To accomplish the high turn-on speed, the driving transistors 222 and 224 and the blocking diodes 230 and 232 are implemented using sufficiently large channel width to have a high switching speed.

When the ESD event has finished and/or before an ESD event occurs, normal operation of the cascode stage 150 is substantially unaffected by the ESD trigger device 100. To prevent the ESD trigger device 100 from affecting normal operation, the example ESD trigger device 100 is provided with at least two current blocking features. The first feature is the resistor 218, which pulls down the gate-coupled transistor 216 to turn off the ESD sensor 102 at the conclusion of an ESD event. The resistor 218 effectively turns off the gate-coupled transistor 216, cutting off current flow through the resistor 226 and thus turning off the driving transistors 222 and 224.

The second feature is the reverse current blocker 106, which, in this example, is implemented using blocking diodes 230 and 232. During an ESD event, the blocking diodes 230 and 232 allow the driving voltage provided by the driving transistors 222 and 224 to drive the output transistors 204 and 202, respectively. In some driving applications, it is desirable to keep the drain-source voltages of the output transistors 202 and 204 as low as possible. Thus, the voltage at the output pad 154 is kept low relative to the ground terminal 156, and the pre-driver 206 will often drive the gate voltage of the cascode transistor 204 higher than the voltage at the output pad 154. Without the blocking diode 232, the gate-drain voltage of the driving transistor 224 (e.g., a p-channel transistor) can become lower than the transistor threshold voltage required to turn the driving transistor 224 partially on, and causing the driving transistor 224 to conduct current in reverse. The addition of the blocking diode 232 (and similarly, the blocking diode 230), prevents the ESD trigger device 100 from affecting normal operation of the cascode stage 150.

Figure 3:
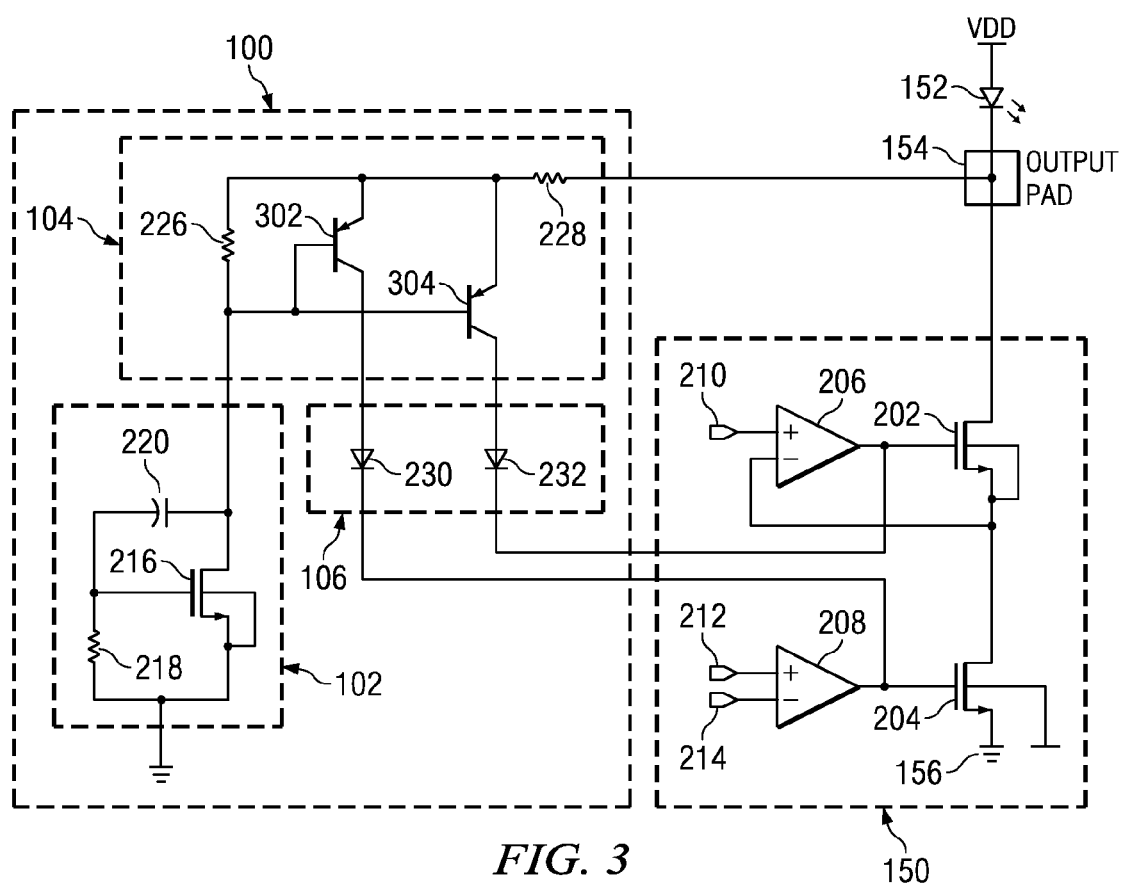
FIG. 3 is a schematic diagram of an alternative example electrostatic discharge trigger device.

In still further examples, any or all of the transistors 202, 204, 216, 222, and/or 224 are implemented using bipolar transistors. FIG. 3 is a schematic diagram of an alternative example electrostatic discharge trigger device 300. In the example of FIG. 3, the driving transistors 302 and 304 are implemented using bipolar transistors. The blocking diodes 230 and 232 are also included to provide reverse current blocking as described above.

Figure 4:
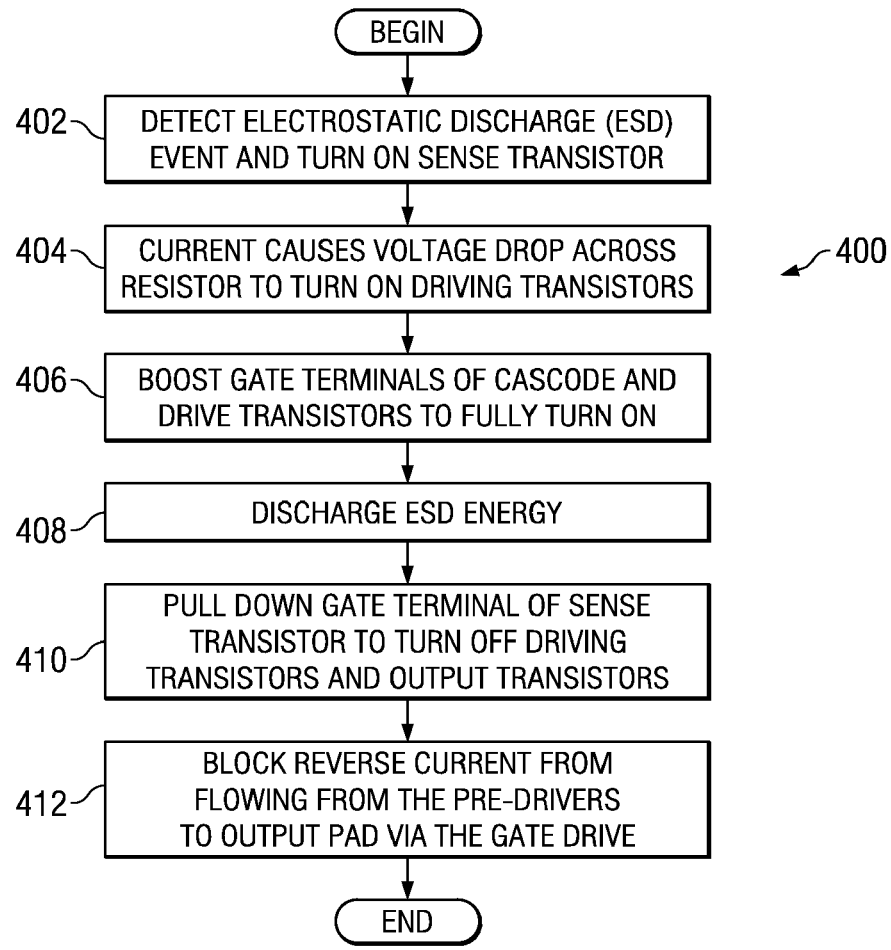
FIG. 4 is a flowchart that illustrates an example process to provide electrostatic discharge protection.

FIG. 4 is a flowchart that illustrates an example process 400 to provide electrostatic discharge protection. The example process 400 may be used to implement the ESD trigger devices 100 to provide ESD protection to the cascode stages 150 of FIGS. 2 and 3. The example process begins when an ESD event occurs at the output pad 154, when the ESD sensor 102 detects the ESD event and turns on the sense transistor 216 (block 402). Turning on the sense transistor 216 causes a current to flow therethrough, which results in current flowing through and a voltage drop across the resistor 226. The voltage drop turns on the driving transistors 222 and 224 (block 404). When the driving transistors 222 and 224 are turned on, the gate voltages of the output transistors 202 and 204 are boosted to turn the output transistors 202 and 204 fully on (block 406).

The output transistors 202 and 204, when fully on, provide a low-resistance path to ground through which the ESD energy is discharged to the ground terminal (block 408). When the ESD energy has been discharged, the resistor 218 pulls down the gate terminal of the sense transistor 216. This reduces the voltage drop across the resistor 226, and turns off the driving transistor 222 and 224 and, thus, the output transistors 202 and 204 (block 410).

During normal operation, the output pad voltage may decrease below the gate voltage from one or both of the pre-drivers 206 or 208. To prevent reverse current from interfering with operation of the output transistors 202 and 204, the reverse current blocker 106 blocks reverse current from flowing from the pre-drivers 206 and 208 to the output pad 154 via the driving transistors 222 and 224 (block 412). The reverse current blocker 106 may repeatedly block reverse current at block 412 to prevent the ESD trigger device 100 from affecting the normal operation of the cascode stage 150. The process 400 may also iterate to protect the cascode stage 150 from repeated ESD events.

Figure 5:
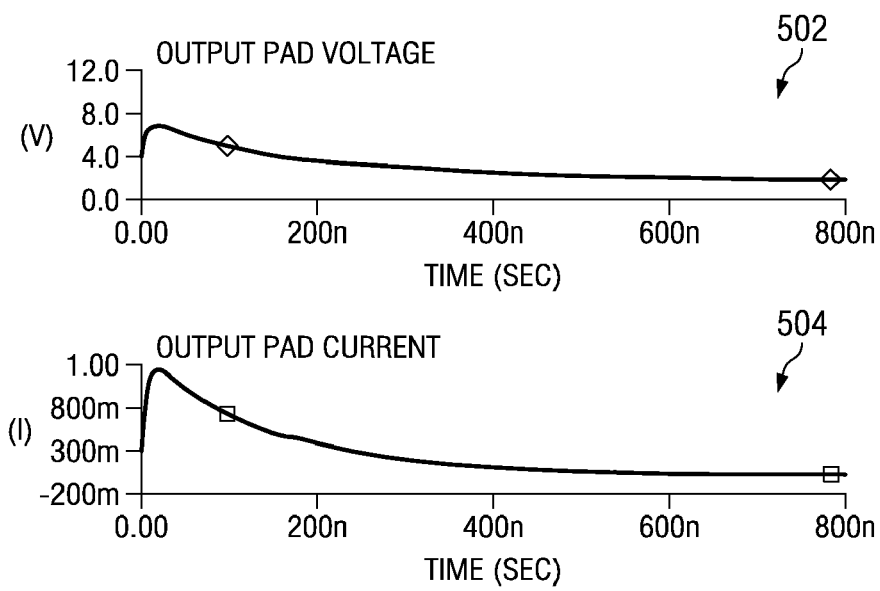
FIG. 5 is a diagram of example output pad voltages and currents for a simulation of an electrostatic discharge event for the electrostatic discharge trigger device of FIG. 2.

FIG. 5 is a diagram of example output pad voltages and currents for a simulation of an ESD event for the ESD trigger device 100 of FIG. 2. The example simulation used in describing the voltage and current results of FIGS. 5-7 utilizes a human body model (HBM) electrostatic discharge test, with a resistor R=1.5 kΩ, an inductor L=7 micro-henries (μH), and a strike voltage VHBM=2 kV. FIG. 5 illustrates the voltage 502 at the output pad 154 relative to the ground terminal 156 and the current 504 flowing through the output pad 156. As shown in FIG. 5, the voltage 502 achieves a peak of approximately 10V within 5 ns, and is subsequently clamped to less than 7V before being discharged (via the output transistors 202 and 204).

Figure 6:
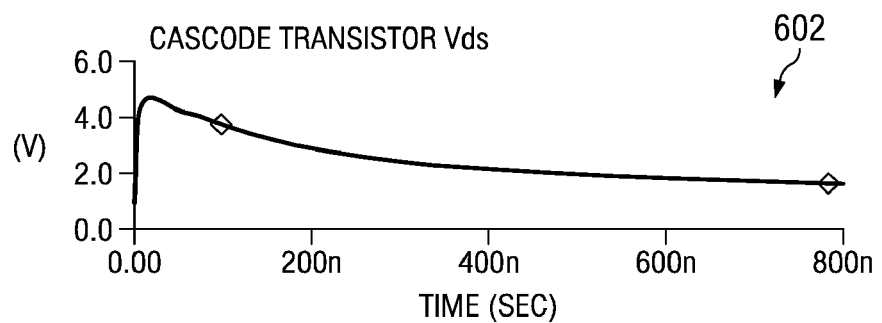
FIG. 6 is a diagram of example voltage waveforms for the cascode transistor for a simulation of an electrostatic discharge event for the electrostatic discharge trigger device of FIG. 2.
Figure 6:
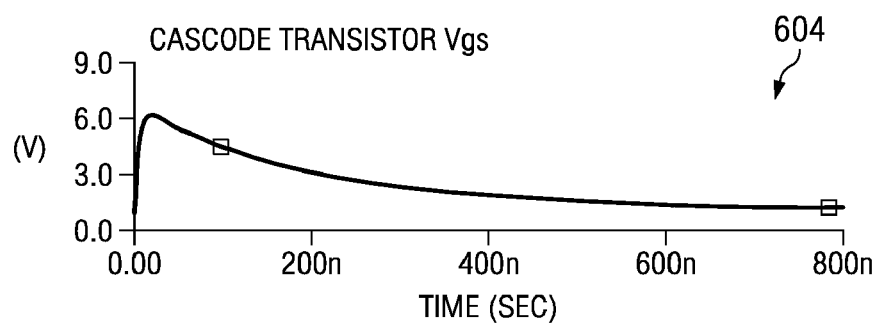

FIG. 6 is a diagram of example voltage waveforms for the cascode transistor 202 for a simulation of an electrostatic discharge event for the ESD trigger device 100 of FIG. 2. The voltage waveforms include a drain-source voltage (Vds) 602 and a gate-source voltage (Vgs) 604. As shown in FIG. 5, Vds 602 increases quickly to represent the ESD event. As described above, the ESD trigger device 100 increases the gate voltage 604, or Vgs, of the cascode transistor 202 very quickly in response to the ESD sensor 102 detecting the ESD event. As the ESD energy is discharged to the ground terminal 156, Vds 602 decreases and Vgs decreases as the driving transistor 224 is slowly turned off.

Figure 7:
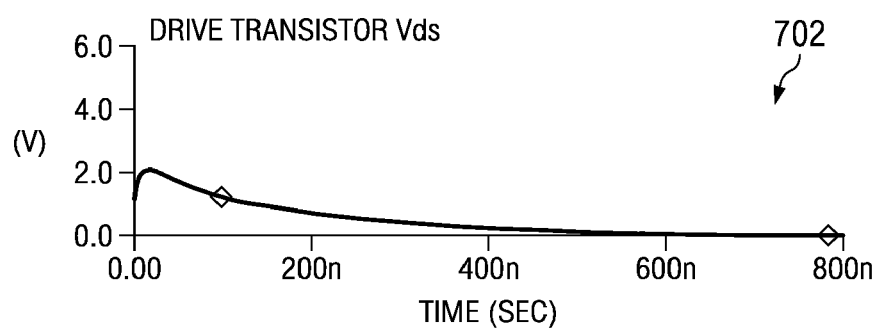
FIG. 7 is a diagram of example voltage waveforms for the drive transistor for a simulation of an electrostatic discharge event for the electrostatic discharge trigger device of FIG. 2.
Figure 7:
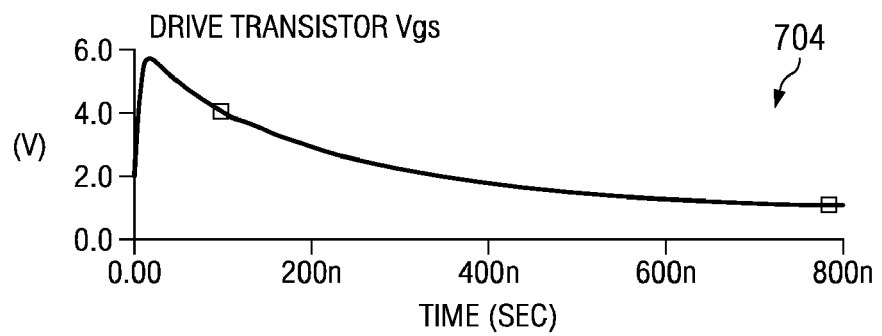

FIG. 7 is a diagram of example voltage waveforms for the drive transistor 204 for a simulation of an ESD event for the ESD trigger device 100 of FIG. 2. In a similar manner as FIG. 6, FIG. 7 includes a Vds 702 and a Vgs 704 for the drive transistor 204. Additionally, because Vds 702 responds to the same ESD event as the output pad voltage 502 and the Vds 602 of the cascode transistor 202, Vds 702 increases at the same time and decreases over the same period. The driving transistor 222 generates Vgs 704 in response to the ESD sensor 102 detecting the ESD event. It should also be noted that the sum of Vds 602 and Vds 702 at any given time is equal to the voltage 502 at the output pad.

Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. An apparatus comprising:
an output pad;
a cascode circuit that is coupled to the output pad and that is configured to selectively couple an output pad to a reference terminal;
a gate drive that is coupled to the output pad and that is configured to turn on the cascode stage in response to a detection of an electrostatic discharge (ESD) event at the output pad;
an ESD sensor that is coupled to the gate drive and that is configured to detect a change in voltage indicative of an ESD event occurring at the output pad; and
a current blocker that is coupled between the gate drive and the cascode configured to prevent current from flowing from the cascode circuit to the output pad through the gate drive while there is not an ESD event.

2. The apparatus of claim 1, wherein the cascode stage comprises a cascode transistor driven by a first pre-driver, and a drive transistor driven by a second pre-driver.

3. The apparatus of claim 2, wherein the gate drive comprises a resistor configured to generate a voltage in response to an ESD event, a first driving transistor to turn the cascode transistor on in response to the voltage generated by the resistor, and a second driving transistor to turn the drive transistor on in response to the voltage generated by the resistor.

4. The apparatus of claim 3, wherein the resistor is configured to generate a voltage drop in response to an ESD event.

5. The apparatus of claim 3, wherein the gate drive further comprises a second resistor configured to reduce a current from the output pad to the driving transistors and the first resistor.

6. The apparatus of claim 2, wherein the current blocker comprises a first blocking diode configured to prevent current flow from the first pre-driver via the gate drive to the output pad, and a second blocking diode configured to prevent current flow from the second pre-driver via the gate drive to the output pad.

7. The apparatus of claim 2, wherein the cascode stage is configured to drive a light-emitting diode based on at least one input signal.

8. The apparatus of claim 1, wherein the ESD sense block comprises a transistor configured to turn on in response to an increase in voltage indicative of an ESD event, and a resistor configured to turn off the transistor when there is not an ESD event.

9. The apparatus of claim 8, wherein the ESD sense block further comprises a capacitive element to modify a frequency response of the transistor.

10. The apparatus of claim 8, wherein the transistor is configured to turn off the gate drive when there is no ESD event.

11. The apparatus of claim 8, wherein the transistor is configured as a gate-coupled transistor.

12. A circuit to provide ESD protection to a cascode stage, the circuit comprising:
   a first pre-driver configured to control a first gate voltage at a cascode transistor and a second pre-driver configured to control a second gate voltage at a drive transistor, wherein the cascode and drive transistors are arranged in a cascode configuration to selectively allow current to flow from an output pad to a reference terminal;
   a gate-coupled transistor configured to detect a change in voltage indicative of an ESD event, and a first resistor configured to turn off the gate-coupled transistor when there is no ESD event;
   a capacitor configured to modify a frequency response of the gate-coupled transistor;
   a first blocking diode and a second blocking diode configured to restrict current flow to one direction;
   a second resistor configured to generate a voltage in response to an ESD event; and
   a first driving transistor to turn on the cascode transistor via the first blocking diode in response to the voltage generated by the second resistor, and a second driving transistor configured to turn on the drive transistor via the second blocking diode in response to the voltage generated by the second resistor.

13. An apparatus comprising:
   a pad;
   an internal circuit; and
   an ESD circuit having:
      a driver having:
         a resistor that is coupled to the pad; and
         a plurality of control circuits, wherein each control circuit is coupled to the resistor and the pad, and wherein each control circuit activates in response to an ESD event;
      a plurality of blocking diodes, wherein each blocking diode is coupled between at least one of the control circuits and the internal circuit; and
      an ESD sensor that is coupled to the resistor.

14. The apparatus of claim 13, wherein each control circuit further comprises a transistor that is coupled to the pad at its first passive electrode, the resistor at its control electrode, and at least one of the blocking diodes at its second passive electrode.

15. The apparatus of claim 14, wherein the resistor further comprises a first resistor, and wherein the driver further comprises a second resistor that is coupled between the pad and the first resistor, and wherein the sources of each transistor are coupled to a node between the first and second resistors.

16. The apparatus of claim 15, wherein each transistor further comprises a PMOS transistor or PNP transistor.

17. The apparatus of claim 13, wherein the resistor further comprises a first resistor, and wherein the ESD sensor further comprises:
   a capacitor that is coupled to the first resistor;
   a second resistor that is coupled to the capacitor; and
   a MOS transistor that is coupled to the capacitor and first resistor at its drain, and a node between the capacitor and the second resistor at its gate.

18. The apparatus of claim 17, wherein the MOS transistor further comprises an NMOS transistor.

19. The apparatus of claim 13, wherein the internal circuit further comprises:
   a first MOS transistor that is coupled to the pad at its source and that is coupled to a first blocking diode from the plurality of blocking diodes at its gate;
   a second MOS transistor that is coupled to the source of the first MOS transistor at its drain and that is coupled to a second blocking diode from the plurality of blocking diodes at its gate;
   a first pre-driver that is coupled to the gate of the first MOS transistor; and
   a second pre-driver that is coupled to the gate of the second MOS transistor.

20. The apparatus of claim 19, wherein the first and second MOS transistors further comprise NMOS transistors.

21. An apparatus comprising:
   a pad;
   a cascode circuit having:
      a first NMOS transistor that is coupled to the pad at its source;
      a second NMOS transistor that is coupled to the source of the first NMOS transistor at its drain;
      a first pre-driver that is coupled to the gate of the first NMOS transistor; and
      a second pre-driver that is coupled to the gate of the second NMOS transistor; and
   an ESD circuit having:
      a driver having:
         a first resistor that is coupled to the pad;
         a second resistor that is coupled to the first resistor; and
         a first p-type transistor that is coupled to a node between the first and second resistors at its first passive electrode and that is coupled to the second resistor at its control electrode; and
         a first p-type transistor that is coupled to the node between the first and second resistors at its first passive electrode and that is coupled to the second resistor at its control electrode;

a first blocking diode that is coupled between the second passive electrode of the first p-type transistor and the gate of the first NMOS transistor;

a second blocking diode that is coupled between the second passive electrode of the second p-type transistor and that gate of the second NMOS transistor; and an ESD sensor that is coupled to the first resistor.

22. The apparatus of claim 21, wherein the ESD sensor further comprises:

a third resistor that is coupled to the capacitor; and a third NMOS transistor that is coupled to the second resistor at its drain, and the third resistor at its gate.

23. The apparatus of claim 22, wherein the ESD sensor further comprises a capacitor that is coupled between the second and third resistors.

24. The apparatus of claim 23, wherein the first and second p-type transistors further comprise first and second PMOS transistors, respectively.

25. The apparatus of claim 23, wherein the first and second p-type transistors further comprise first and second PNP transistors, respectively.

* * * * *